US010256374B2

United States Patent
Asai

(10) Patent No.: US 10,256,374 B2
(45) Date of Patent: Apr. 9, 2019

(54) LIGHT EMITTING DEVICE

(71) Applicant: NICHIA CORPORATION, Anan-shi, Tokushima (JP)

(72) Inventor: Kenji Asai, Naruto (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/435,603

(22) Filed: Feb. 17, 2017

(65) Prior Publication Data

US 2017/0256684 A1    Sep. 7, 2017

(30) Foreign Application Priority Data

Mar. 4, 2016 (JP) ................. 2016-041727
Mar. 15, 2016 (JP) ................. 2016-050496
Apr. 28, 2016 (JP) ................. 2016-090013

(51) Int. Cl.
| | | |
|---|---|---|
| H01L 33/50 | (2010.01) | |
| H01L 33/32 | (2010.01) | |
| C09K 11/77 | (2006.01) | |
| C09K 11/66 | (2006.01) | |
| C09K 11/08 | (2006.01) | |

(52) U.S. Cl.
CPC ........ H01L 33/504 (2013.01); C09K 11/0883 (2013.01); C09K 11/665 (2013.01); C09K 11/7734 (2013.01); C09K 11/7774 (2013.01); H01L 33/32 (2013.01)

(58) Field of Classification Search
CPC ............................ H01L 33/504; H01L 33/32
See application file for complete search history.

(56) References Cited

U.S. PATENT DOCUMENTS

| | | | |
|---|---|---|---|
| 2007/0259206 A1 | 11/2007 | Oshio | |
| 2009/0146549 A1 | 6/2009 | Kimura et al. | |
| 2013/0257266 A1* | 10/2013 | Ishizaki | H01L 33/504 |
| | | | 313/503 |
| 2013/0264937 A1* | 10/2013 | Sakuta | H01L 33/504 |
| | | | 313/503 |
| 2015/0349213 A1* | 12/2015 | Hosokawa | H01L 33/502 |
| | | | 257/98 |

FOREIGN PATENT DOCUMENTS

| | | |
|---|---|---|
| JP | 2003-535477 A | 11/2003 |
| JP | 2008-034188 A | 2/2008 |
| JP | 2011-155297 A | 8/2011 |
| JP | 2015-067755 A | 4/2015 |
| WO | 2008-020541 A1 | 2/2008 |

* cited by examiner

*Primary Examiner* — Jamie C Niesz
(74) *Attorney, Agent, or Firm* — Hunton Andrews Kurth LLP

(57) ABSTRACT

A light emitting device that is capable of achieving excellent color rendering property is provided. The light emitting device contains a light emitting element having a light emission peak wavelength within a range of 430 nm or more and 470 nm or less, and a fluorescent member. The fluorescent member contains a first fluorescent material that contains an Eu-activated alkaline earth aluminate, a second fluorescent material that contains a Mn-activated fluorogermanate, a third fluorescent material that contains a Ce-activated rare earth aluminate, and a fourth fluorescent material that contains an Eu-activated silicon nitride having Al and at least one of Sr and Ca.

24 Claims, 8 Drawing Sheets

LIGHT EMITTING DEVICE

CROSS-REFERENCE TO RELATED APPLICATIONS

This application claims the benefit of Japanese Patent Application No. 2016-041727, filed on Mar. 4, 2016, Japanese Patent Application No. 2016-050496, filed on Mar. 15, 2016, and Japanese Patent Application No. 2016-090013, filed on Apr. 28, 2016, the disclosures of which are hereby incorporated by reference in their entirety.

BACKGROUND

Technical Field

The present disclosure relates to a light emitting device.

Description of Related Art

Examples of a light emitting device emitting white light using a light emitting diode (which may be hereinafter referred to as an "LED") include a light emitting device having a combination of an LED emitting blue light and a fluorescent material emitting yellow light. The light emitting device emits white light through mixing of the blue light from the LED and the yellow light from the fluorescent material excited by the blue light.

The light emitting device has a large radiation intensity in the visible region and a large luminous efficiency, but there may be some cases where sufficient radiation intensities cannot be obtained in the blue-green region and the red region. Accordingly, there is room of improvement in a general color rendering index, which is an index of the visibility of the color of the irradiated object (i.e., a color rendering property).

The evaluation procedure for the color rendering property of a light source is determined by JIS Z8726 in such a manner that the standard test colors (R1 to R15) having the prescribed reflectance characteristics are measured for colors with a test light source and the reference light source, and the color differences $\Delta Ei$ (wherein i represents an integer of from 1 to 15) are numerically calculated therefrom. The upper limit of the color rendering indices Ri (wherein i represents an integer of from 1 to 15) is 100. Therefore, when the color difference between the test light source and the reference light source with a color temperature corresponding thereto is smaller, the color rendering index is increased and is close to 100.

Japanese Unexamined Patent Publication No. 2003-535477 discloses a light emitting device, in which the light emitting device uses an LED emitting blue light and, as two kinds of fluorescent materials emitting green light to yellow light, for example, a chlorosilicate fluorescent material and a garnet phosphor of Y or Tb for enhancing the color rendering property of right source. Japanese Unexamined Patent Publication No. 2008-034188 discloses a light emitting device using a fluorescent material emitting red light, in addition to a fluorescent light emitting green light to yellow light for further enhancing the color rendering property.

SUMMARY

Light emitting devices for illumination purposes have a wide range of needs including, for example, a general lighting equipment for household use and a special lighting equipment demanded to have high color rendering property, such as a medical lighting equipment and a museum lighting equipment. It is not easy to control the light emission spectrum to match the reference light sources of color temperature demanded in these various purposes, and thereby to provide a light source that has extremely small color differences in the color rendering indices Ri. In particular, in the case where white mixed color light is to be provided by combining plural kinds of fluorescent materials including a fluorescent material emitting yellow light to green light and a fluorescent material emitting red light, the adjustment of the color components in the light emission spectra of the fluorescent materials becomes complicated, as compared to the case where only one kind of a fluorescent material emitting yellow light is used. Furthermore, in the case where a light emission spectrum that has an extremely small color difference in the particular color rendering index Ri with respect to the reference light source, there is a large possibility that any of the other color differences is increased.

An object of the present invention is to provide a light emitting device that is capable of achieving excellent color rendering property.

A first embodiment of the present disclosure encompasses a light emitting device containing a light emitting element having a light emission peak wavelength within a range of 430 nm or more and 470 nm or less, and a fluorescent member, the light emitting device emitting light having a correlated color temperature in a range of 3,500 K or more and 4,500 K or less, the fluorescent member containing a first fluorescent material that contains an Eu-activated alkaline earth aluminate, a second fluorescent material that contains a Mn-activated fluorogermanate, a third fluorescent material that contains a Ce-activated rare earth aluminate, and a fourth fluorescent material that contains an Eu-activated silicon nitride having Al, and at least one of Sr and Ca, the first fluorescent material having a content ratio in a range of 3.0% by mass or more and 55.0% by mass or less based on a total fluorescent material amount.

A second embodiment of the present disclosure encompasses a light emitting device containing a light emitting element having a light emission peak wavelength within a range of 430 nm or more and 470 nm or less, and a fluorescent member, the light emitting device emitting light having a correlated color temperature in a range of 4,500 K or more and 5,500 K or less, the fluorescent member containing a first fluorescent material that contains an Eu-activated an alkaline earth aluminate, a second fluorescent material that contains a Mn-activated fluorogermanate, a third fluorescent material that contains a Ce-activated rare earth aluminate, and a fourth fluorescent material that contains an Eu-activated silicon nitride having Al, and at least one of Sr and Ca, the first fluorescent material having a content ratio in a range of 3.5% by mass or more and 65.0% by mass or less based on a total fluorescent material amount.

A third embodiment of the present disclosure encompasses a light emitting device containing a light emitting element having a light emission peak wavelength within a range of 430 nm or more and 470 nm or less, and a fluorescent member, the light emitting device emitting light having a correlated color temperature in a range of 5,500 K or more and 7,000 K or less, the fluorescent member containing a first fluorescent material that contains an Eu-activated alkaline earth aluminate, a second fluorescent material that contains a Mn-activated fluorogermanate, a third fluorescent material that contains a Ce-activated rare earth aluminate, and a fourth fluorescent material that contains an Eu-activated silicon nitride having Al, and at least one of Sr and Ca, the first fluorescent material having a content ratio of 7.5% by mass or more and 55.0% by mass or less based on a total fluorescent material amount.

Embodiments according to the present disclosure can provide the light emitting device that is capable of achieving excellent color rendering property.

DETAILED DESCRIPTION

Embodiments for practicing the present invention will be described below. The embodiments described below only exemplify light emitting devices for practicing the technical concept of the present invention, and the scope the invention is not limited to the light emitting devices shown below. In the specification, the relationship between the color name and the chromaticity coordinate, the relationship between the wavelength range of light and the color name of monochromic light, and the like are in accordance with JIS Z8110. In the case where a composition contains plural substances that correspond to one component, the content of the component in the composition means the total amount of the plural substances contained in the composition, unless otherwise indicated.

Figure 1:
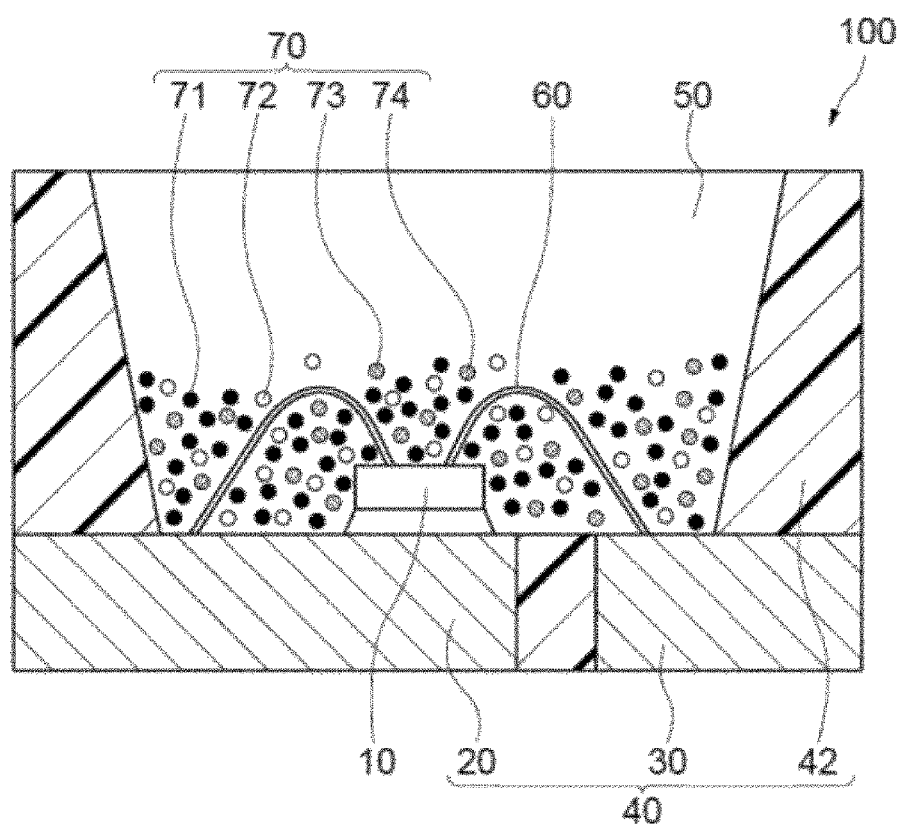
FIG. 1 is a schematic cross-sectional view showing an exemplary of a light emitting device.

FIG. 1 shows a schematic cross sectional view of a light emitting device 100 according to one embodiment. The light emitting device 100 contains a light emitting element 10 having a light emission peak wavelength within a range of 430 nm or more and 470 nm or less, and a fluorescent member 50. The fluorescent member 50 contains a first fluorescent material 71 that contains an Eu-activated alkaline earth aluminate, a second fluorescent material 72 that contains a Mn-activated fluorogermanate, a third fluorescent material 73 that contains a Ce-activated rare earth aluminate, and a fourth fluorescent material 74 that contains an Eu-activated silicon nitride having Al and at least one of Sr and Ca. In the following specification, the first fluorescent material 71, the second fluorescent material 72, the third fluorescent material 73, and the fourth fluorescent material 74 may collectively be referred to as a fluorescent material 70.

The combination use of the light emitting element 10 having a light emission peak wavelength within a range of 430 nm or more and 470 nm or less with the first fluorescent material 71 to the fourth fluorescent material 74 enables to make the light emission spectrum of the light emitting device close to the spectrum of the reference light source over the relatively wide range from the short wavelength side to the long wavelength side. According to this constitution, excellent color rendering property can be achieved.

CIE (the International Commission on Illumination) has announced the guidance for color rendering property that fluorescent lamps should have, in 1986, and according to the guidance, a favorable general color rendering index (which may be hereinafter referred to as Ra) appropriate to the place of use is 60 or more and less than 80 for factories for general operations, 80 or more and less than 90 for residential houses, hotels, restaurants, shops, offices, schools, hospitals, factories for precise operations, and the like, and 90 or more for places for clinical laboratories requiring high color rendering property, museums, and the like.

The light emitting device 100 has Ra of, for example, 80 or more, preferably 90 or more, and more preferably 95 or more. The upper limit of Ra is 100. The special color rendering indices are expressed by indices R9 to R15, and it is designated that R9 is for red, R10 is for yellow, R11 is for green, R12 is for blue, R13 is for the Caucasian skin color, R14 is for the color of leaves, and R15 is for the Japanese skin color. In particular, the index R9 is often considered in an illumination device used under an environment where edible meat is handled, and the fidelity of hue for all the colors is often considered in an illumination device used under an environment relating to apparel and photograph. It has been said that the special color rendering indices are also preferably as high as possible, and the light emitting device of the embodiment has R9 to R15 of, for example, 40 or more, preferably 50 or more, and more preferably 60 or more. The upper limits of R9 to R15 each are 100.

The light emitted by the light emitting device 100 is mixed color light of the light emitted by the light emitting element 10 and fluorescent light emitted by the first fluorescent material 71, the second fluorescent material 72, the third fluorescent material 73, and the fourth fluorescent material 74, which may be light included in a range of x=0.00 to 0.50 and y=0.00 to 0.50 in the chromaticity coordinate defined in CIE 1931, or may be light included in a range of x=0.25 to 0.40 and y=0.25 to 0.40.

The light emitted by the light emitting device 100 may have a correlated color temperature, for example, of 3,000 K or more, or 3,500 K or more. The correlated color temperature thereof may be 7,500 K or less, or 7,000 K or less.

The light emitting device 100 will be described in more detail below. The light emitting device 100 emits light of a short wavelength side of the visible region (for example, in a range of 380 nm or more and 485 nm or less), and contains the light emitting element 10 of a gallium nitride compound semiconductor having a light emission peak wavelength in a range of 430 nm or more and 470 nm or less, and a molded article 40 carrying the light emitting element 10. The molded article 40 contains a first lead 20 and a second lead 30 that are integrated by molding with a resin portion 42 containing a thermoplastic resin or a thermosetting resin. The molded article 40 forms a depression having a bottom surface and a side surface, and the bottom surface of the depression carries the light emitting element 10. The light emitting element 10 has one pair of an anode and a cathode, and the anode and the cathode in the pair are electrically connected to the first lead 20 and the second lead 30 respectively with wires 60. The light emitting element 10 is covered with the fluorescent member 50.

Fluorescent Member 50

The fluorescent member 50 contains the fluorescent material 70 that converts the wavelength of the light from the light emitting element 10, and a resin. The resin preferably contains a thermosetting resin, such as an epoxy resin, a silicone resin, an epoxy-modified silicone resin, and a modified silicone resin. The fluorescent material 70 contains the first fluorescent material 71, the second fluorescent material 72, the third fluorescent material 73, and the fourth fluorescent material 74. The fluorescent member 50 contains the fluorescent material 70, and depending on necessity, may further contain other materials. For example, a light diffusion material may be contained to reduce the directionality of the light from the light emitting element for broadening the viewing angle.

The fluorescent member 50 not only functions as the wavelength converting member for the light emitted from the light emitting element 10 due to the fluorescent material 70 contained therein, but also functions as a member protecting the light emitting element 10 from the external environment. In FIG. 1, the fluorescent material 70 is localized in the fluorescent member 50. By disposing the fluorescent material 70 close to the light emitting element 10 in this manner, the wavelength conversion of the light from the light emitting element 10 can be efficiently performed, thereby providing a light emitting device excellent in light emission efficiency. The arrangement of the fluorescent member 50 containing the florescent material 70 and the light emitting element 10 is not limited to the arrangement, in which they are disposed to be close to each other, and the light emitting element 10 and the fluorescent material 70 may be spaced in the fluorescent member 50 in consideration of the influence of heat on the fluorescent material 70. The fluorescent material 70 may be mixed in the fluorescent member 50 in a substantially uniform proportion over the entire of the fluorescent member 50, and thereby the color unevenness can be suppressed.

Light Emitting Element 10

The light emitting element 10 has a light emission peak wavelength within a range of 430 nm or more and 470 nm or less, preferably within a range of 440 nm or more and 460 nm or less, and more preferably within a range of 445 nm or more and 455 nm or less. The use of the light emitting element 10 having a light emission peak wavelength within the range enables the effective utilization of the light emitted externally from the light emitting element, so as to reduce the loss of the light emitted from the light emitting element, and thereby a light emitting device having a high light emission efficiency can be provided.

The light emitting element 10 used is preferably a semiconductor light emitting element, such as an LED. The use of a semiconductor light emitting element as the light source can provide a light emitting device that has a high efficiency and a high linearity of the output with respect to the input, and is stable with high resistance to mechanical impacts.

Examples of the semiconductor light emitting element used include a semiconductor light emitting element emitting blue light, or the like using a nitride semiconductor (for example, $In_XAl_YGa_{1-X-Y}N$, wherein X and Y satisfy $0 \leq X$, $0 \leq Y$, and $X+Y \leq 1$). The half value width of the light emission spectrum of the light emitting element 10 is not particularly limited. The half value width may be, for example, 30 nm or less.

Fluorescent Material 70

The light emitting device 100 contains the fluorescent member 50 containing the first fluorescent material 71 to the fourth fluorescent material 74 as described above. The first fluorescent material 71 to the fourth fluorescent material 74 each are not limited to only one composition, and a combination of plural fluorescent materials different in composition may be used for each of them. The compositional ratio of the first fluorescent material 71, the second fluorescent material 72, the third fluorescent material 73, and the fourth fluorescent material 74 may be appropriately selected to make the characteristics of the light emitting device, such as the light emission efficiency, the color rendering property, and the like, within the desired ranges.

First Fluorescent Material 71

The first fluorescent material 71 is a fluorescent material that contains an Eu-activated alkaline earth aluminate. The first fluorescent material 71 preferably has the composition shown by the following formula (1) and is preferably a fluorescent material emitting green light activated by europium. According to the constitution, the light emission characteristics of the first fluorescent material 71 described later can be relatively easily obtained.

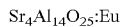
$$Sr_4Al_{14}O_{25}:Eu \tag{1}$$

The first fluorescent material 71 preferably has a maximum excitation wavelength of 270 nm or more and 470 nm or less, and more preferably 370 nm or more and 460 nm or less, for exciting the fluorescent material within the light emission peak wavelength of the light emitting element 10 described above. The first fluorescent material 71 preferably has a light emission peak wavelength within a range of 440 nm or more and 550 nm or less, and more preferably within a range of 460 nm or more and 530 nm or less. When the light emission peak wavelength is in the range, the overlaps to the light emission spectrum of the light emitting element 10 and the light emission spectrum of the third fluorescent material 73 described later can be reduced to make the light emission spectrum of the first fluorescent material 71 close to the reference light source, and thereby the color rendering property of the light emitting device 100 can be enhanced. The half value width of the light emission spectrum of the first fluorescent material 71 may be, for example, 58 nm or more and 78 nm or less, and preferably 63 nm or more and 73 nm or less. When the half value width is in the range, the color purity can be enhanced to make the light emission spectrum within the green region close to the reference light source, and thereby the color rendering property of the light emitting device 100 can be enhanced.

Content Ratio of First Fluorescent Material 71 Based on Total Fluorescent Material Amount In the case of the light emitting device 100 emitting light having a correlated color temperature in a range of 3,500 K or more and 4,500 K or less, the content ratio of the first fluorescent material 71 based on the total fluorescent material amount is 3% by mass or more, preferably 6% by mass or more, more preferably 15% by mass or more, and further preferably 30% by mass or more. The content ratio of the first fluorescent material 71 based on the total fluorescent material amount is 55% by mass or less, preferably 50% by mass or less, more preferably 45% by mass or less, and further preferably 40% by mass or less. When the content ratio is in the range, the light emission spectrum of the light emitting device 100 emitting light having a correlated color temperature in the range of 3,500 K or more and 4,500 K or less can be made further close to the reference light source, and thereby the color rendering property can be further enhanced.

In the case of the light emitting device 100 emitting light having a correlated color temperature in a range of 4,500 K or more and 5,500 K or less, the content ratio of the first fluorescent material 71 based on the total fluorescent material amount is 3.5% by mass or more, preferably 6.5% by mass or more, more preferably 15.0% by mass or more, and further preferably 30.0% by mass or more. The content ratio of the first fluorescent material 71 based on the total fluorescent material amount is 65.0% by mass or less, preferably 55.0% by mass or less, more preferably 50.0% by mass or less, and further preferably 45.0% by mass or less. When the content ratio is in the range, the light emission spectrum of the light emitting device 100 emitting light having a correlated color temperature in the range of 4,500 K or more and 5,500 K or less can be made further close to the reference light source, and thereby the color rendering property can be further enhanced.

In the case of the light emitting device 100 emitting light having a correlated color temperature in a range of 5,500 K or more and 7,000 K or less, the content ratio of the first fluorescent material 71 based on the total fluorescent material amount is 7.5% by mass or more, preferably 10% by mass or more, more preferably 20% by mass or more, and further preferably 30% by mass or more. The content ratio of the first fluorescent material 71 based on the total fluorescent material amount is 55% by mass or less, preferably 50% by mass or less, more preferably 45% by mass or less, and further preferably 40% by mass or less. When the content ratio is in the range, the light emission spectrum of the light emitting device 100 emitting light having a correlated color temperature in the range of 5,500 K or more and 7,000 K or less can be made further close to the reference light source, and thereby the color rendering property can be further enhanced.

Second Fluorescent Material 72

The second fluorescent material 72 is a fluorescent material that contains a Mn-activated fluorogermanate. The second fluorescent material 72 preferably has the composition shown by the following formula (2) and is preferably a fluorescent material emitting dark red light activated by manganese. The light emission peak wavelength of the fluorescent material is 650 nm or more, which is relatively larger than the other fluorescent materials emitting red light. Accordingly, the light emission spectrum on the long wavelength side can be made close to the reference light source, and thereby the color rendering property of the light emitting device 100 can be enhanced.

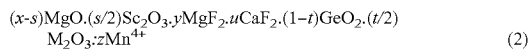
$$(x-s)\text{MgO}.(s/2)\text{Sc}_2\text{O}_3.y\text{MgF}_2.u\text{CaF}_2.(1-t)\text{GeO}_2.(t/2)\text{M}_2\text{O}_3{:}z\text{Mn}^{4+} \quad (2)$$

In the formula (2), x, y, z, s, t, and u satisfy $2.0 \leq x \leq 4.0$, $0 < y < 1.5$, $0 < z < 0.05$, $0 \leq s < 0.5$, $0 < t < 0.5$, and $0 \leq u < 1.5$, and preferably satisfy $y+u < 1.5$. In the formula (2), M represents at least one element selected from the group consisting of Al, Ga, and In.

In the formula (2), s and t preferably satisfy $0.05 \leq s \leq 0.3$ and $0.05 \leq t < 0.3$, and according to the constitution, the luminance can be further enhanced. Furthermore, the formula (2) is preferably represented by the following formula:

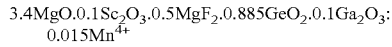
$$3.4\text{MgO}.0.1\text{Sc}_2\text{O}_3.0.5\text{MgF}_2.0.885\text{GeO}_2.0.1\text{Ga}_2\text{O}_3{:}0.015\text{Mn}^{4+}$$

According to this constitution, the second fluorescent material 72 can be efficiently excited with light having a wavelength range containing the light emission peak wavelength of the light emitting element.

The half value width of the light emission spectrum of the second fluorescent material 72 is not particularly limited, and may be, for example, 45 nm or less, and preferably 40 nm or less. When the half value width is in the range, the color purity can be enhanced to make the light emission spectrum within the red region close to the reference light source, and thereby the color rendering property of the light emitting device 100 can be enhanced. The light emission spectrum of the second fluorescent material 72 preferably has an average light emission intensity in a range of 600 nm or more and 620 nm or less of 20% or less, and more preferably 10% or less, with respect to the maximum light emission intensity as 100%. When the average light emission intensity in the range is the upper limit of less, the overlap of the light emission spectrum of the second fluorescent material 72 to the light emission spectrum of the fourth fluorescent material 74 can be reduced, and thereby the color rendering property can be enhanced through the effect of the light emission spectrum of the fourth fluorescent material 74.

Content Ratio of Second Fluorescent Material 72 Based on Total Fluorescent Material Amount In the case of the light emitting device 100 emitting light having a correlated color temperature in a range of 3,500 K or more and 4,500 K or less, the content ratio of the second fluorescent material 72 based on the total fluorescent material amount may be, for example, 25% by mass or more, preferably 28% by mass or more, and more preferably 30% by mass or more. The content ratio of the second fluorescent material 72 based on the total fluorescent material amount may be, for example, 37% by mass or less, preferably 36% by mass or less, and more preferably 33% by mass or less. When the content ratio is in the range, the light emission spectrum of the light emitting device 100 emitting light having a correlated color temperature in a range of 3,500 K or more and 4,500 K or less can be made further close to the reference light source, and thereby the color rendering property can be further enhanced.

In the case of the light emitting device 100 emitting light having a correlated color temperature in a range of 4,500 K or more and 5,500 K or less, the content ratio of the second fluorescent material 72 based on the total fluorescent material amount may be, for example, 22% by mass or more, preferably 24% by mass or more, and more preferably 26% by mass or more. The content ratio of the second fluorescent material 72 based on the total fluorescent material amount may be, for example, 32% by mass or less, preferably 31% by mass or less, and more preferably 29% by mass or less. When the content ratio is in the range, the light emission spectrum of the light emitting device 100 emitting light having a correlated color temperature in the range of 4,500 K or more and 5,500 K or less can be made further close to the reference light source, and thereby the color rendering property can be further enhanced.

In the case of the light emitting device 100 emitting light having a correlated color temperature in a range of 5,500 K or more and 7,000 K or less, the content ratio of the second fluorescent material 72 based on the total fluorescent material amount may be, for example, 16% by mass or more, preferably 17% by mass or more, and more preferably 18% by mass or more. The content ratio of the second fluorescent material 72 based on the total fluorescent material amount may be, for example, 24% by mass or less, preferably 20% by mass or less, and more preferably 19% by mass or less. When the content ratio is in the range, the light emission spectrum of the light emitting device 100 emitting light having a correlated color temperature in the range of 5,500 K or more and 7,000 K or less can be made further close to the reference light source, and thereby the color rendering property can be further enhanced.

Third Fluorescent Material 73

The third fluorescent material 73 is a fluorescent material that contains a Ce-activated rare earth aluminate. The third fluorescent material 73 preferably has the composition shown by the following formula (3) and is preferably a fluorescent material emitting yellow light activated by cerium. According to the constitution, the light emission characteristics of the third fluorescent material 73 described later can be relatively easily obtained.

$$Y_3Al_5O_{12}:Ce \qquad (3)$$

The third fluorescent material 73 preferably has a maximum excitation wavelength in a range of 220 nm or more and 490 nm or less, and more preferably a maximum excitation wavelength in a range of 430 nm or more and 470 nm or less, for exciting the fluorescent material within the light emission peak wavelength of the light emitting element 10 described above. The third fluorescent material 73 preferably has a light emission peak wavelength in a range of 480 nm or more and 630 nm or less, and more preferably in a range of 500 nm or more and 560 nm or less. When the light emission peak wavelength is in the range, the overlaps to the light emission spectrum of the first fluorescent material 71 and the light emission spectrum of the fourth fluorescent material 74 described later can be reduced to make the light emission spectrum of the third fluorescent material 73 close to the reference light source, and thereby the color rendering property of the light emitting device 100 can be enhanced. The half value width of the light emission spectrum of the third fluorescent material 73 may be, for example, in a range of 95 nm or more and 115 nm or less, and preferably in a range of 100 nm or more and 110 nm or less. When the half value width is in the range, the color purity can be enhanced to make the light emission spectrum within the yellow region close to the reference light source, and thereby the color rendering property of the light emitting device 100 can be enhanced.

Content Ratio of Third Fluorescent Material 73 Based on Total Fluorescent Material Amount In the case of the light emitting device 100 emitting light having a correlated color temperature in a range of 3,500 K or more and 4,500 K or less, the content ratio of the third fluorescent material 73 based on the total fluorescent material amount may be, for example, 18% by mass or more, preferably 20% by mass or more, and more preferably 27% by mass or more. The content ratio of the third fluorescent material 73 based on the total fluorescent material amount may be, for example, 59% by mass or less, preferably 50% by mass or less, and more preferably 35% by mass or less. When the content ratio is in the range, the light emission spectrum of the light emitting device 100 emitting light having a correlated color temperature in the range of 3,500 K or more and 4,500 K or less can be made further close to the reference light source, and thereby the color rendering property can be further enhanced.

In the case of the light emitting device 100 emitting light having a correlated color temperature in a range of 4,500 K or more and 5,500 K or less, the content ratio of the third fluorescent material 73 based on the total fluorescent material amount may be, for example, 20% by mass or more, preferably 25% by mass or more, and more preferably 30% by mass or more. The content ratio of the third fluorescent material 73 based on the total fluorescent material amount may be, for example, 60% by mass or less, preferably 50% by mass or less, and more preferably 35% by mass or less. When the content ratio is in the range, the light emission spectrum of the light emitting device 100 emitting light having a correlated color temperature in the range of 4,500 K or more and 5,500 K or less can be made further close to the reference light source, and thereby the color rendering property can be further enhanced.

In the case of the light emitting device 100 emitting light having a correlated color temperature in a range of 5,500 K or more and 7,000 K or less, the content ratio of the third fluorescent material 73 based on the total fluorescent material amount may be, for example, 25% by mass or more, preferably 30% by mass or more, and more preferably 35% by mass or more. The content ratio of the third fluorescent material 73 based on the total fluorescent material amount may be, for example, 70% by mass or less, preferably 60% by mass or less, and more preferably 50% by mass or less. When the content ratio is in the range, the light emission spectrum of the light emitting device 100 emitting light having a correlated color temperature in the range of 5,500 K or more and 7,000 K or less can be made further close to the reference light source, and thereby the color rendering property can be further enhanced.

Fourth Fluorescent Material 74

The fourth fluorescent material 74 is a fluorescent material that contains an Eu-activated silicon nitride having Al and at least one of Sr and Ca (expressed as (Sr,Ca) herein). The fourth fluorescent material 74 preferably has the composition shown by the following formula (4) and is preferably a fluorescent material emitting red light activated by europium. According to this constitution, the light emission characteristics of the fourth fluorescent material 74 described later can be relatively easily obtained.

$$(Sr,Ca)AlSiN_3:Eu \qquad (4)$$

The fourth fluorescent material 74 contains at least one selected from the group consisting of Sr and Ca, and preferably contains both Sr and Ca, and the content ratio of Sr in Sr and Ca is preferably 0.8% by mol or more, for making the light emission peak wavelength of the fourth fluorescent material 74 within the range shown below.

The fourth fluorescent material 74 preferably has a light emission peak wavelength in a range of 620 nm or more and 650 nm or less, and more preferably in the range of 630 nm or more and 645 nm or less. When the light emission peak wavelength is the lower limit or more, the light emission component between the light emission peak wavelength of the second fluorescent material 72 and the light emission peak wavelength of the fourth fluorescent material 74 may not be short, and the light emission spectrum can be close to the reference light source. When the light emission peak wavelength is the upper limit or less, the overlap of the light emission spectrum of the fourth fluorescent material 74 to the light emission spectrum of the second fluorescent material 72 can be reduced, and thereby the color rendering property can be enhanced through the effect of the light emission spectrum of the second fluorescent material 72. The half value width of the light emission spectrum of the fourth fluorescent material 74 may be, for example, in a range of 80 nm or more and 100 nm or less, and preferably in a range of 85 nm or more and 95 nm or less. When the half value width is in the range, the overlap of the light emission spectrum of the fourth fluorescent material 74 to the light emission spectrum of the second fluorescent material 72 can be reduced, and thereby the color rendering property can be enhanced through the effect of the light emission spectrum of the second fluorescent material 72.

Content Ratio of Fourth Fluorescent Material 74 Based on Total Fluorescent Material Amount In the case of the light emitting device 100 emitting light having a correlated color temperature in a range of 3,500 K or more and 4,500 K or less, the content ratio of the fourth fluorescent material 74 based on the total fluorescent material amount may be, for example, in a range of 2.9% by mass or more and 3.3% by mass or less. When the content ratio is in the range, the light emission spectrum of the light emitting device 100 can be made further close to the reference light source, and thereby the color rendering property can be further enhanced.

In the case of the light emitting device 100 emitting light having a correlated color temperature in a range of 4,500 K or more and 5,500 K or less, the content ratio of the fourth fluorescent material 74 based on the total fluorescent material amount may be, for example, in a range of 2.8% by mass or more and 3.0% by mass or less. When the content ratio is in the range, the light emission spectrum of the light emitting device 100 can be made further close to the reference light source, and thereby the color rendering property can be further enhanced.

In the case of the light emitting device 100 emitting light having a correlated color temperature in a range of 5,500 K or more and 7,000 K or less, the content ratio of the fourth fluorescent material 74 based on the total fluorescent material amount may be, for example, in a range of 2.4% by mass or more and 2.9% by mass or less. When the content ratio is in the range, the light emission spectrum of the light emitting device 100 can be made further close to the reference light source, and thereby the color rendering property can be further enhanced.

Content Ratio of First Fluorescent Material 71 Based on Third Fluorescent Material 73

In the case of the light emitting device 100 emitting light having a correlated color temperature in a range of 3,500 K or more and 4,500 K or less, the content ratio of the first fluorescent material 71 to the third fluorescent material 73 is preferably in a range of 0.05 or more and 3.00 or less, more preferably in a range of 0.50 or more and 2.00 or less, and further preferably in a range of 1.00 or more and 1.50 or less. When the content ratio is in the range, the light emission spectrum of the light emitting device 100 can be made further close to the reference light source, and thereby the color rendering property can be further enhanced.

In the case of the light emitting device 100 emitting light having a correlated color temperature in a range of 4,500 K or more and 5,500 K or less, the content ratio of the first fluorescent material 71 to the third fluorescent material 73 is preferably in a range of 0.06 or more and 4.70 or less, more preferably in a range of 0.30 or more and 2.70 or less, and further preferably in a range of 1.00 or more and 1.50 or less. When the content ratio is in the range, the light emission spectrum of the light emitting device 100 can be made further close to the reference light source, and thereby the color rendering property can be further enhanced.

In the case of the light emitting device 100 emitting light having a correlated color temperature in a range of 5,500 K or more and 7,000 K or less, the content ratio of the first fluorescent material 71 to the third fluorescent material 73 is preferably in a range of 0.10 or more and 2.10 or less, more preferably in a range of 0.20 or more and 1.5 or less, and further preferably in a range of 0.40 or more and 1.00 or less. When the content ratio is in the range, the light emission spectrum of the light emitting device 100 can be made further close to the reference light source, and thereby the color rendering property can be further enhanced.

Light Emission Peak Intensity Ratio of First Fluorescent Material 71 Based on Light Emitting Element 10

In the light emission spectrum obtained from the light emitting device 100 having the fluorescent member 50 containing the first fluorescent material 71, in which the abscissa is the wavelength and the ordinate is the light emission intensity, the light emission peak intensity ratio of the first fluorescent material 71 based on the light emission peak intensity of the light emitting element 10 is not particularly limited, and may be appropriately selected depending on the target correlated color temperature and the desired light emission characteristics.

In the case of the light emitting device 100 emitting light having a correlated color temperature in a range of 3,500 K or more and 4,500 K or less, the light emission peak intensity ratio of the first fluorescent material 71 based on the light emitting element 10 is preferably in a range of 0.40 or more and 0.75 or less, more preferably in a range of 0.45 or more and 0.70 or less, and further preferably 0.50 or more and 0.65 or less, with the light emission intensity of the light emitting element 10 as 1. When the light emission intensity ratio is in the range, the light emission spectrum of the light emitting device 100 can be made further close to the reference light source, and thereby the color rendering property can be further enhanced.

In the case of the light emitting device 100 emitting light having a correlated color temperature in a range of 4,500 K or more and 5,500 K or less, the light emission peak intensity ratio of the first fluorescent material 71 based on the light emitting element 10 is preferably in a range of 0.34 or more and 0.60 or less, more preferably in a range of 0.35 or more and 0.55 or less, and further preferably in a range of 0.40 or more and 0.50 or less, with the light emission intensity of the light emitting element 10 as 1. When the light emission intensity ratio is in the range, the light emission spectrum of the light emitting device 100 can be made further close to the reference light source, and thereby the color rendering property can be further enhanced.

In the case of the light emitting device 100 emitting light having a correlated color temperature of in a range of 5,500 K or more and 7,000 K or less, the light emission peak intensity ratio of the first fluorescent material 71 based on the light emitting element 10 is preferably in a range of 0.25 or more and 0.42 or less, more preferably in a range of 0.30 or more and 0.40 or less, and further preferably in a range of 0.33 or more and 0.38 or less, with the light emission intensity of the light emitting element 10 as 1. When the light emission intensity ratio is in the range, the light emission spectrum of the light emitting device 100 can be made further close to the reference light source, and thereby the color rendering property can be further enhanced.

The light emitting device 100 may further contain an additional fluorescent material other than the first fluorescent material 71 to the fourth fluorescent material 74. In the case where the light emitting device 100 contains the additional fluorescent material, the content thereof is not particularly limited, and may be appropriately controlled to provide the light emission characteristics according to the present invention.

EXAMPLES

Fluorescent Materials

The fluorescent materials shown below were prepared as the fluorescent materials for Examples and Comparative Examples. As the first fluorescent material 71, a fluorescent material emitting green light having a composition of $Sr_4Al_{14}O_{25}:Eu$ having a light emission peak wavelength around 494 nm (hereinafter referred to as "SAE") was prepared. As the second fluorescent material 72, a fluorescent material emitting dark red light having a composition of $3.4MgO \cdot 0.1Sc_2O_3 \cdot 0.5MgF_2 \cdot 0.885GeO_2 \cdot 0.1Ga_2O_3 : 0.015Mn^{4+}$ having a light emission peak wavelength around 658 nm (hereinafter referred to as "MGF") was prepared. As the third fluorescent material 73, a rare earth aluminum garnet fluorescent material having a composition of $Y_3Al_5O_{12}$:Ce having a light emission peak wavelength around 544 nm (hereinafter referred to as "YAG") was prepared. As the fourth fluorescent material 74, a nitride fluorescent material emitting red light having a composition of (Sr,Ca)AlSiN$_3$:Eu having a light emission peak wavelength around 635 nm (hereinafter referred to as "SCASN") was prepared.

Example 1

A light emitting device was produced by combining an LED emitting blue light having a light emission peak wavelength of 450 nm with the fluorescent materials SAE, MGF, YAG, and SCASN.

The fluorescent materials having content ratios shown in Table I below and prepared to have a correlated color temperature of approximately 5,000 K were added to a silicone resin, and mixed and dispersed therein, and the mixture was deaerated, so as to provide a fluorescent material-containing resin composition. The fluorescent material-containing resin composition was injected and filled on the light emitting element (i.e., the LED), and the assembly was then heated to cure the resin composition. A light emitting device was thus produced in the aforementioned process.

Examples 2 to 4

Light emitting devices were produced in the same manner as in Example 1 except that the amounts of the fluorescent materials were changed to make the content ratios of the fluorescent materials shown in Table 1 below.

The light emitting devices obtained in Examples 1 to 4 were measured for the chromaticity coordinate of the light emission color, the correlated color temperature (Tcp; K), the general color rendering index (Ra), and the special color rendering indices (R9 to R15). In the following description, the general color rendering index and the special color rendering indices are totally and simply referred to as "color rendering indices".

The light emission spectra of the light emitting devices of Examples 1 to 4 were measured with a spectrofluorophotometer, F-4500, manufactured by Hitachi High-Technologies Corporation. The measurements in Examples and Comparative Examples described later were performed in the same manner.

The results except for the color rendering indices for Examples 1 to 4 are shown in Table 1 below, and the results of their color rendering indices are shown in Table 2 below. In Table 2, Rt shows the sum of the color rendering indices R9 to R15.

TABLE 1

|  |  | Example 1 | Example 2 | Example 3 | Example 4 |
|---|---|---|---|---|---|
| Content ratio of fluorescent material (%) First fluorescent material/ total fluorescent material amount | | 6.9 | 17.5 | 35.7 | 53.8 |
| Content ratio of fluorescent material (%) Second fluorescent material/ total fluorescent material amount | | 31.4 | 30.1 | 28.6 | 23.2 |
| Content ratio of fluorescent material (%) Third fluorescent material/ total fluorescent material amount | | 58.9 | 49.4 | 32.9 | 20.1 |
| Content ratio of fluorescent material (%) Fourth fluorescent material/ total fluorescent material amount | | 2.8 | 3.0 | 2.8 | 3.0 |
| Content ratio of fluorescent materials First fluorescent material/ third fluorescent material | | 0.12 | 0.35 | 1.08 | 2.68 |
| Light emission peak intensity ratio First fluorescent material/ light emitting device | | 0.34 | 0.36 | 0.47 | 0.56 |
| Chromaticity | x | 0.348 | 0.345 | 0.343 | 0.348 |
| coordinate | y | 0.354 | 0.35 | 0.354 | 0.354 |
| Correlated color temperature (K) | | 4874 | 4962 | 5084 | 4893 |

TABLE 2

|  | Example 1 | Example 2 | Example 3 | Example 4 |
|---|---|---|---|---|
| Ra | 90.1 | 93.4 | 97.4 | 90.2 |
| R1 | 89.9 | 93.9 | 97.7 | 88.8 |
| R2 | 92.2 | 95.4 | 99.0 | 91.1 |
| R3 | 91.0 | 93.3 | 98.5 | 94.7 |
| R4 | 89.6 | 93.1 | 97.7 | 90.4 |
| R5 | 88.4 | 92.3 | 96.7 | 89.9 |
| R6 | 85.8 | 89.8 | 95.8 | 89.4 |
| R7 | 95.5 | 96.5 | 97.2 | 91.0 |
| R8 | 88.5 | 92.8 | 96.9 | 86.8 |
| R9 | 65.6 | 80.7 | 95.8 | 66.5 |
| R10 | 78.2 | 87.0 | 98.5 | 80.2 |
| R11 | 87.0 | 92.2 | 98.3 | 89.1 |
| R12 | 59.1 | 65.1 | 75.1 | 74.1 |
| R13 | 90.0 | 94.7 | 98.6 | 88.5 |
| R14 | 94.5 | 96.1 | 98.9 | 96.7 |
| R15 | 89.4 | 94.3 | 95.7 | 86.2 |
| Rt | 564 | 610 | 661 | 581 |

Comparative Example 1

A light emitting device was produced in the same manner as in Example 1 except that SAE was not used, but a combination of MGF, YAG, and SCASN was used. The content ratios of the fluorescent materials are shown in Table 3 below.

Comparative Examples 2 and 3

Light emitting devices were produced in the same manner as in Example 1 except that the amounts of the fluorescent materials were changed to make the content ratios shown in Table 3 below.

For the light emitting devices obtained in Comparative Examples 1 to 3, the results except for the color rendering indices are shown in Table 3 below, and the results of the color rendering indices are shown in Table 4 below.

TABLE 3

|  |  | Comparative Example 1 | Comparative Example 2 | Comparative Example 3 |
|---|---|---|---|---|
| Content ratio of fluorescent material (%) First fluorescent material/total fluorescent material amount | | — | 3.4 | 67.0 |
| Content ratio of fluorescent material (%) Second fluorescent material/total fluorescent material amount | | 33.2 | 32.2 | 16.2 |
| Content ratio of fluorescent material (%) Third fluorescent material/total fluorescent material amount | | 64.1 | 61.6 | 13.9 |
| Content ratio of fluorescent material (%) Fourth fluorescent material/total fluorescent material amount | | 2.7 | 2.7 | 2.9 |
| Content ratio of fluorescent materials First fluorescent material/third fluorescent material | | — | 0.05 | 4.8 |
| Light emission peak intensity ratio First fluorescent material/light emitting device | | — | 0.33 | 0.66 |
| Chromaticity coordinate | x | 0.35 | 0.349 | 0.347 |
| | y | 0.355 | 0.355 | 0.355 |
| Correlated color temperature (K) | | 4818 | 4864 | 4918 |

TABLE 4

|  | Comparative Example 1 | Comparative Example 2 | Comparative Example 3 |
|---|---|---|---|
| Ra | 87.9 | 88.4 | 83.7 |
| R1 | 87.6 | 87.9 | 81.7 |
| R2 | 90.0 | 90.6 | 85.2 |
| R3 | 88.7 | 89.7 | 89.1 |
| R4 | 87.5 | 87.9 | 83.6 |
| R5 | 86.1 | 86.5 | 83.1 |
| R6 | 82.9 | 83.7 | 81.5 |
| R7 | 93.9 | 94.4 | 86.3 |
| R8 | 86.5 | 86.5 | 79.1 |
| R9 | 61.0 | 61.2 | 44.3 |
| R10 | 74.0 | 75.5 | 65.7 |
| R11 | 84.9 | 85.5 | 81.2 |
| R12 | 56.9 | 57.3 | 71.5 |
| R13 | 87.9 | 88.5 | 81.0 |
| R14 | 93.5 | 94.1 | 93.6 |
| R15 | 87.8 | 87.9 | 79.0 |
| Rt | 546 | 550 | 516 |

As can be observed in Tables 1 and 2, Examples 1 to 4 each have larger Rt than Comparative Examples 1 to 3. By controlling the amount of SAE, light emitting devices having high color rendering property may thus be provided.

As can be observed in Table 4, Comparative Examples 1 to 3 each has smaller Rt than the Examples, and poor color rendering property of the light emitting device is obtained.

As shown in Table 1, Examples 1 to 4 each has a correlated color temperature in a range of 4,500 K or more and 5,500 K or less. Examples 2, 3, and 4 each has a content ratio of SAE based on the total fluorescent material amount in a range of 7.0% by mass or more and 55.0% by mass or less, a content ratio of MGF based on the total fluorescent material amount in a range of 22.0% by mass or more and 31.0% by mass or less, a content ratio of YAG based on the total fluorescent material amount in a range of 20.0% by mass or more and 55.0% by mass or less, a content ratio of SCASN based on the total fluorescent material amount in a range of 2.8% by mass or more and 3.0% by mass or less, and a content ratio of the first fluorescent material 71 (SAE) based on the third fluorescent material 73 (YAG) in a range of 0.30 or more and 2.70 or less. According to the content ratios, the light emission spectra of the light emitting devices can be made close to the reference light source. Examples 2, 3, and 4 each has a general color rendering index Ra of 90 or more, special color rendering indices R9, R10, R11, R12, R13, R14, and R15 each of 60 or more, and Rt of 570 or more. It is understood from these values that particularly excellent color rendering property is obtained.

Figure 2:
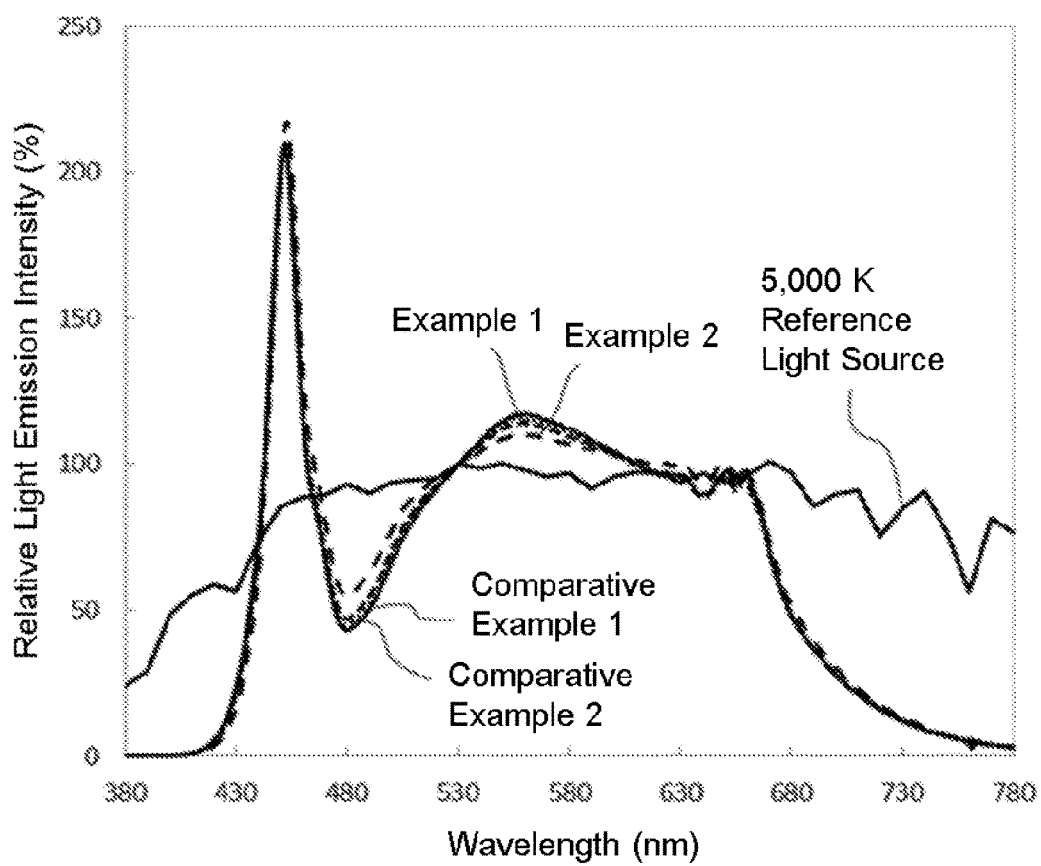
FIG. 2 is a graph showing the light emission spectra of light emitting devices of Examples 1 and 2 and Comparative Examples 1 and 2.
Figure 3:
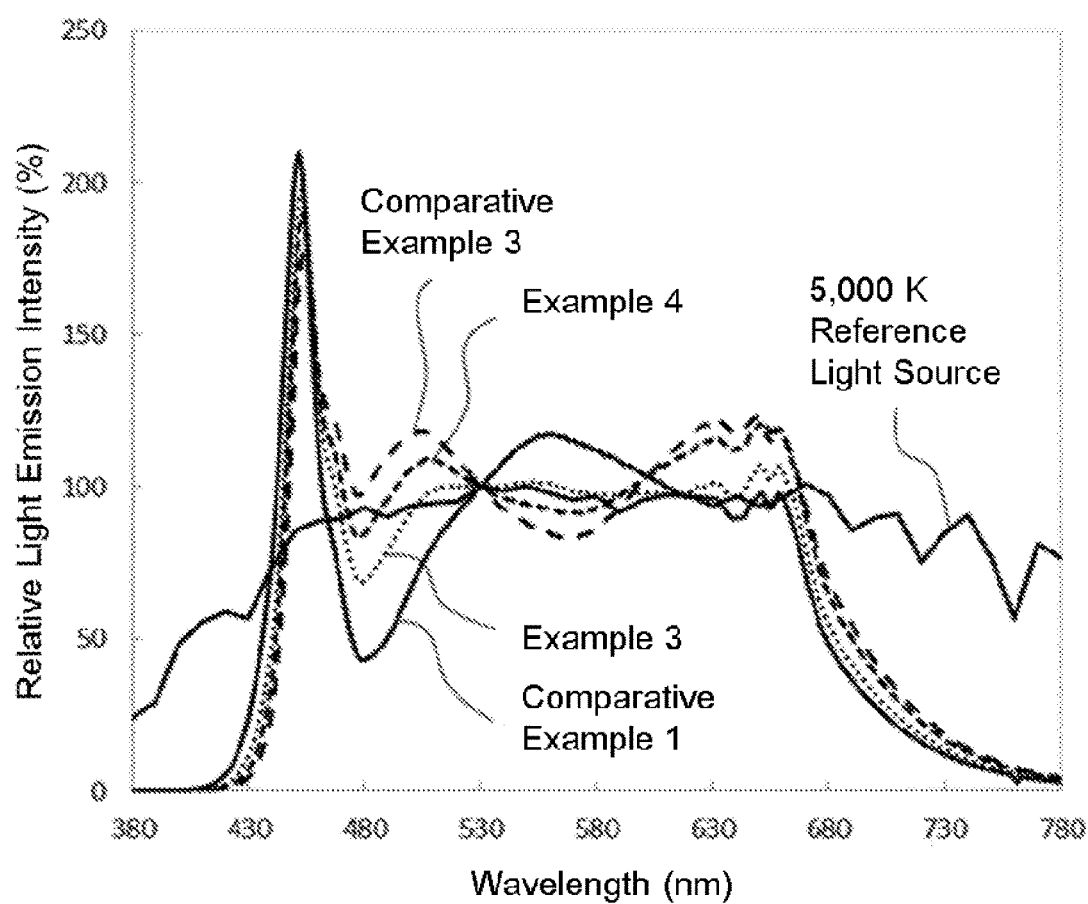
FIG. 3 is a graph showing the light emission spectra of light emitting devices of Examples 3 and 4 and Comparative Examples 1 and 3.

FIG. 2 shows the light emission spectra of the light emitting devices of Examples 1 and 2 and Comparative Examples 1 and 2, and FIG. 3 shows the light emission spectra of the light emitting devices of Examples 3 and 4 and Comparative Examples 1 and 3, the light emission spectra being normalized based on the light emission intensity at 530 nm. The light emission spectra in FIGS. 2 and 3 each show the relative light emission intensity with respect to the wavelength. The spectrum of the reference light source at 5,000 K is also shown in the figures. As shown in Table 1, Examples 2, 3, and 4 each has a light emission peak intensity ratio of the first fluorescent material 71 to the light emitting element 10 in a range of 0.35 or more and 0.60 or less. As shown in Table 2, Examples 2, 3, and 4 each has a general color rendering index Ra of 90 or more, special color rendering indices R9, R10, R11, R12, R13, R14, and R15 each of 60 or more, and Rt of 570 or more. It is understood from these values that particularly excellent color rendering property is obtained.

Examples 5 to 10

Light emitting devices were produced in the same manner as in Example 1 except that the amounts of the fluorescent materials were changed to make the content ratios shown in Table 5 below, and the correlated color temperature was controlled to around 4,000 K.

For the light emitting devices obtained in Examples 5 to 10, the results except for the color rendering indices are shown in Table 5 below, and the results of the color rendering indices are shown in Table 6 below.

TABLE 5

|  | Example 5 | Example 6 | Example 7 | Example 8 | Example 9 | Example 10 |
| --- | --- | --- | --- | --- | --- | --- |
| Content ratio of fluorescent material (%) First fluorescent material/total fluorescent material amount | 3.2 | 6.4 | 15.9 | 35.9 | 43.1 | 50.7 |
| Content ratio of fluorescent material (%) Second fluorescent material/total fluorescent material amount | 36.4 | 35.9 | 36.4 | 31.0 | 28.2 | 27.6 |
| Content ratio of fluorescent material (%) Third fluorescent material/total fluorescent material amount | 57.6 | 54.8 | 44.9 | 30.1 | 25.6 | 18.5 |
| Content ratio of fluorescent material (%) Fourth fluorescent material/total fluorescent material amount | 2.9 | 2.9 | 2.9 | 3.0 | 3.2 | 3.2 |
| Content ratio of fluorescent materials First fluorescent material/third fluorescent material | 0.06 | 0.12 | 0.35 | 1.19 | 1.69 | 2.7 |
| Light emission peak intensity ratio First fluorescent material/light emitting device | 0.41 | 0.43 | 0.55 | 0.61 | 0.58 | 0.67 |
| Chromaticity coordinate x | 0.381 | 0.38 | 0.388 | 0.382 | 0.376 | 0.384 |
| Chromaticity coordinate y | 0.381 | 0.382 | 0.396 | 0.384 | 0.371 | 0.374 |
| Correlated color temperature (K) | 4002 | 4038 | 3922 | 4005 | 4061 | 3862 |

TABLE 6

|  | Example 5 | Example 6 | Example 7 | Example 8 | Example 9 | Example 10 |
| --- | --- | --- | --- | --- | --- | --- |
| Ra | 88.8 | 89.4 | 90.2 | 97.3 | 94.0 | 88.9 |
| R1 | 87.9 | 88.5 | 88.8 | 98.5 | 92.9 | 86.9 |
| R2 | 91.0 | 91.5 | 91.8 | 98.9 | 94.5 | 89.8 |
| R3 | 91.2 | 92.1 | 93.7 | 99.0 | 97.7 | 94.1 |
| R4 | 88.1 | 88.7 | 89.3 | 96.1 | 94.3 | 88.9 |
| R5 | 86.5 | 87.1 | 87.4 | 96.7 | 93.2 | 87.0 |
| R6 | 85.1 | 86.0 | 87.4 | 97.3 | 92.4 | 85.7 |
| R7 | 94.8 | 95.4 | 96.6 | 96.0 | 94.7 | 92.3 |
| R8 | 85.9 | 86.6 | 86.8 | 96.0 | 92.6 | 86.4 |
| R9 | 62.1 | 63.8 | 64.0 | 96.8 | 82.6 | 66.1 |
| R10 | 76.9 | 78.8 | 80.2 | 98.1 | 88.4 | 77.1 |
| R11 | 85.5 | 86.5 | 87.8 | 99.0 | 92.6 | 85.0 |
| R12 | 60.9 | 61.6 | 62.5 | 74.7 | 77.2 | 75.6 |
| R13 | 88.3 | 89.1 | 89.1 | 98.6 | 92.7 | 86.6 |
| R14 | 94.8 | 95.4 | 96.3 | 98.8 | 98.5 | 96.7 |
| R15 | 87.4 | 87.7 | 86.5 | 95.5 | 91.4 | 85.6 |
| Rt | 556 | 563 | 566 | 661 | 623 | 573 |

Comparative Example 4

A light emitting device was produced in the same manner as in Example 1 except that SAE was not used, but a combination of MGF, YAG, and SCASN was used, and the correlated color temperature was controlled to around 4,000 K. The content ratios of the fluorescent materials are shown in Table 7 below.

Comparative Example 5

A light emitting device was produced in the same manner as in Example 1 except that the amounts of the fluorescent materials were changed to make the content ratios shown in Table 7 below.

For the light emitting devices obtained in Comparative Examples 4 and 5, the results except for the color rendering indices are shown in Table 7 below, and the results of the color rendering indices are shown in Table 8 below.

TABLE 7

|  | Comparative Example 4 | Comparative Example 5 |
| --- | --- | --- |
| Content ratio of fluorescent material (%) First fluorescent material/total fluorescent material amount | — | 63.0 |
| Content ratio of fluorescent material (%) Second fluorescent material/total fluorescent material amount | 37.7 | 21.3 |
| Content ratio of fluorescent material (%) Third fluorescent material/total fluorescent material amount | 59.5 | 13.0 |
| Content ratio of fluorescent material (%) Fourth fluorescent material/total fluorescent material amount | 2.9 | 2.8 |
| Content ratio of fluorescent materials First fluorescent material/third fluorescent material | — | 4.8 |
| Light emission peak intensity ratio First fluorescent material/light emitting device | — | 0.95 |
| Chromaticity coordinate x | 0.381 | 0.391 |
| Chromaticity coordinate y | 0.381 | 0.387 |
| Correlated color temperature (K) | 4008 | 3783 |

TABLE 8

|  | Comparative Example 4 | Comparative Example 5 |
| --- | --- | --- |
| Ra | 87.9 | 84.0 |
| R1 | 87.0 | 82.5 |
| R2 | 90.1 | 86.3 |
| R3 | 90.5 | 89.8 |
| R4 | 87.3 | 82.9 |
| R5 | 85.6 | 82.3 |
| R6 | 83.9 | 80.1 |
| R7 | 94.4 | 87.5 |
| R8 | 85.1 | 80.9 |
| R9 | 59.8 | 55.8 |
| R10 | 75.1 | 67.7 |
| R11 | 84.4 | 78.4 |
| R12 | 59.4 | 71.8 |
| R13 | 87.4 | 82.0 |
| R14 | 94.4 | 94.3 |
| R15 | 86.4 | 82.4 |
| Rt | 547 | 532 |

As can be observed in Tables 5 and 6, Examples 5 to 10 each has larger Rt than Comparative Examples 4 and 5. By controlling the amount of SAE, light emitting devices having high color rendering property may thus be provided.

As can be observed in Table 8, Comparative Examples 4 and 5 each has smaller Rt than the Examples, and poor color rendering property of the light emitting device is obtained.

As shown in Table 5, Examples 5 to 10 each has a correlated color temperature in a range of 3,500 K or more and 4,500 K or less. Examples 5 to 10 each has a content ratio of SAE based on the total fluorescent material amount in a range of 3.0% by mass or more and 55.0% by mass or less, a content ratio of MGF based on the total fluorescent material amount in a range of 25.0% by mass or more and 37.0% by mass or less, a content ratio of YAG based on the total fluorescent material amount in a range of 18.0% by mass or more and 59.0% by mass or less, a content ratio of SCASN based on the total fluorescent material amount in a range of 2.9% by mass or more and 3.3% by mass or less, and a content ratio of the first fluorescent material 71 (SAE) based on the third fluorescent material 73 (YAG) in a range of 0.05 or more and 3.00 or less. In Examples 5 to 10, according to the content ratios, the light emission spectrum of the light emitting device can be made close to the reference light source. Examples 5 to 10 each has special color rendering indices R9, R10, R11, R12, R13, R14, and R15 each of 60 or more, and Rt of 555 or more. It is understood from these values that particularly excellent color rendering property is obtained.

Examples 8 and 9 each has a content ratio of SAE based on the total fluorescent material amount in a range of 16.5% by mass or more and 50.0% by mass or less, a content ratio of MGF based on the total fluorescent material amount in a range of 28.0% by mass or more and 33.0% by mass or less, a content ratio of YAG based on the total fluorescent material amount in a range of 20.0% by mass or more and 35.0% by mass or less, a content ratio of SCASN based on the total fluorescent material amount in a range of 3.0% by mass or more and 3.2% by mass or less, and a content ratio of the first fluorescent material 71 (SAE) based on the third fluorescent material 73 (YAG) in a range of 0.40 or more and 2.60 or less. Examples 8 and 9 each has a general color rendering index Ra of 90 or more, special color rendering indices R9, R10, R11, R12, R13, R14, and R15 each of 60 or more, and Rt of 600 or more. It is understood from these values that particularly excellent color rendering property is obtained.

Figure 4:
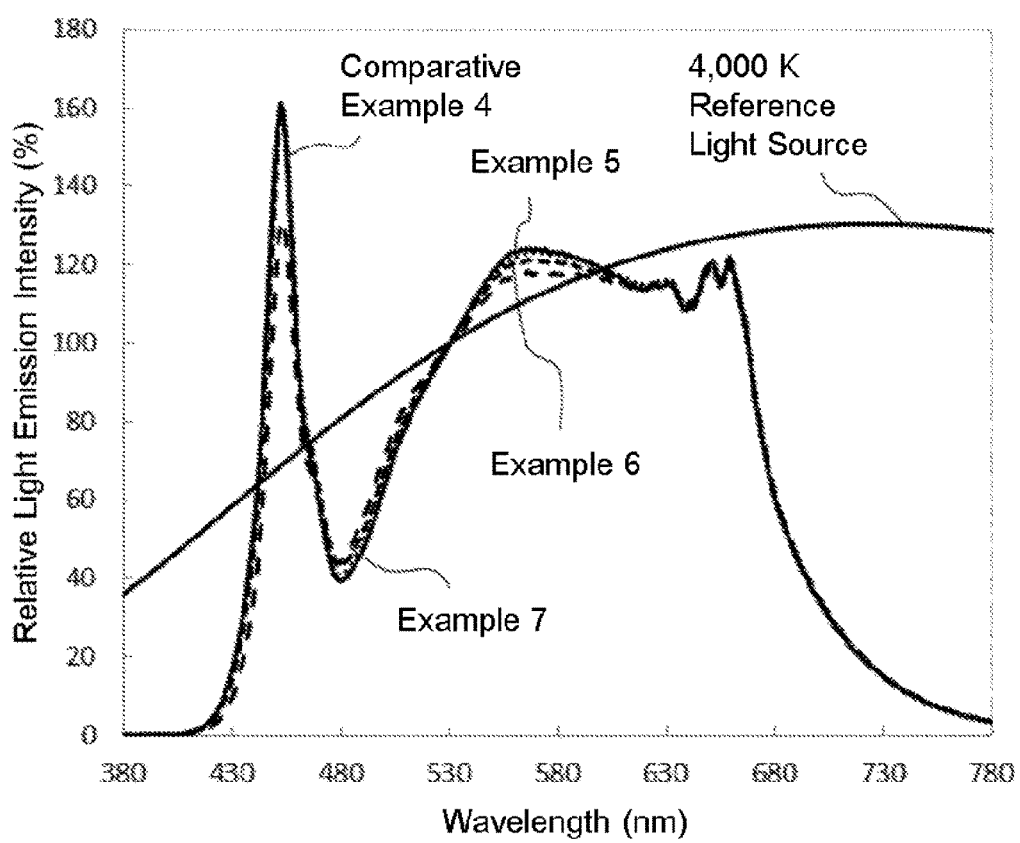
FIG. 4 is a graph showing the light emission spectra of light emitting devices of Examples 5 to 7 and Comparative Example 4.
Figure 5:
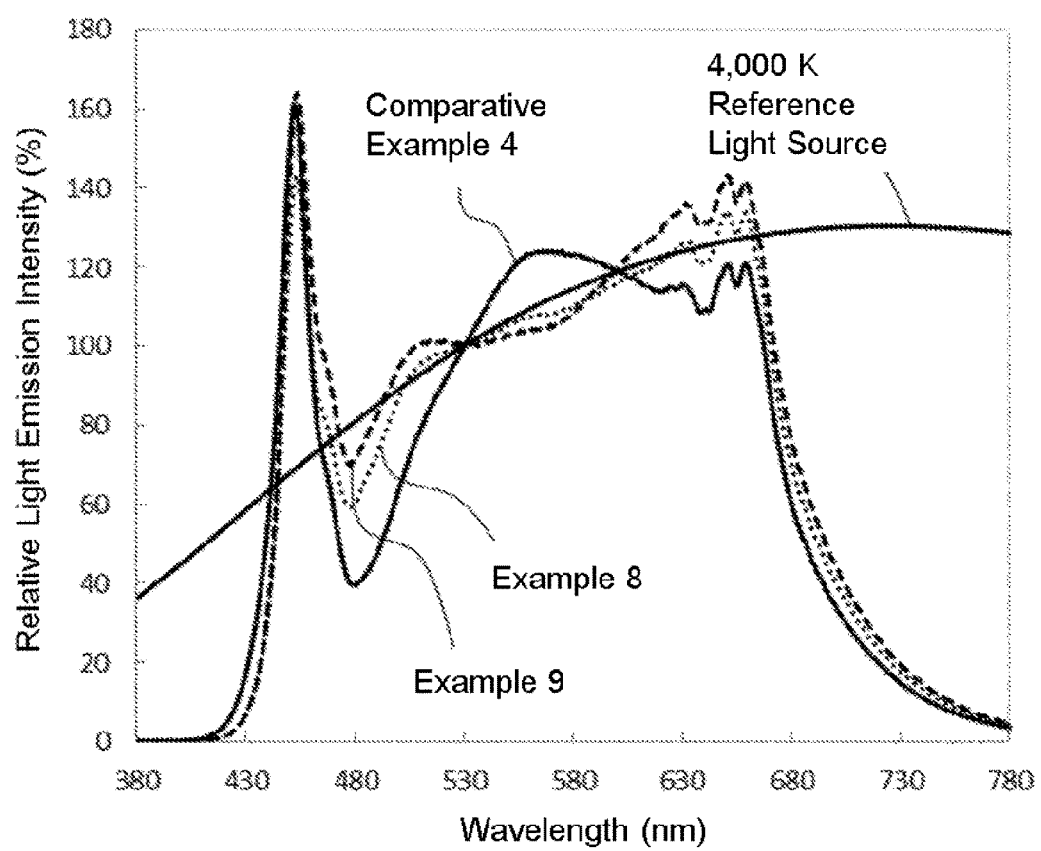
FIG. 5 is a graph showing the light emission spectra of light emitting devices of Examples 8 and 9 and Comparative Example 4.
Figure 6:
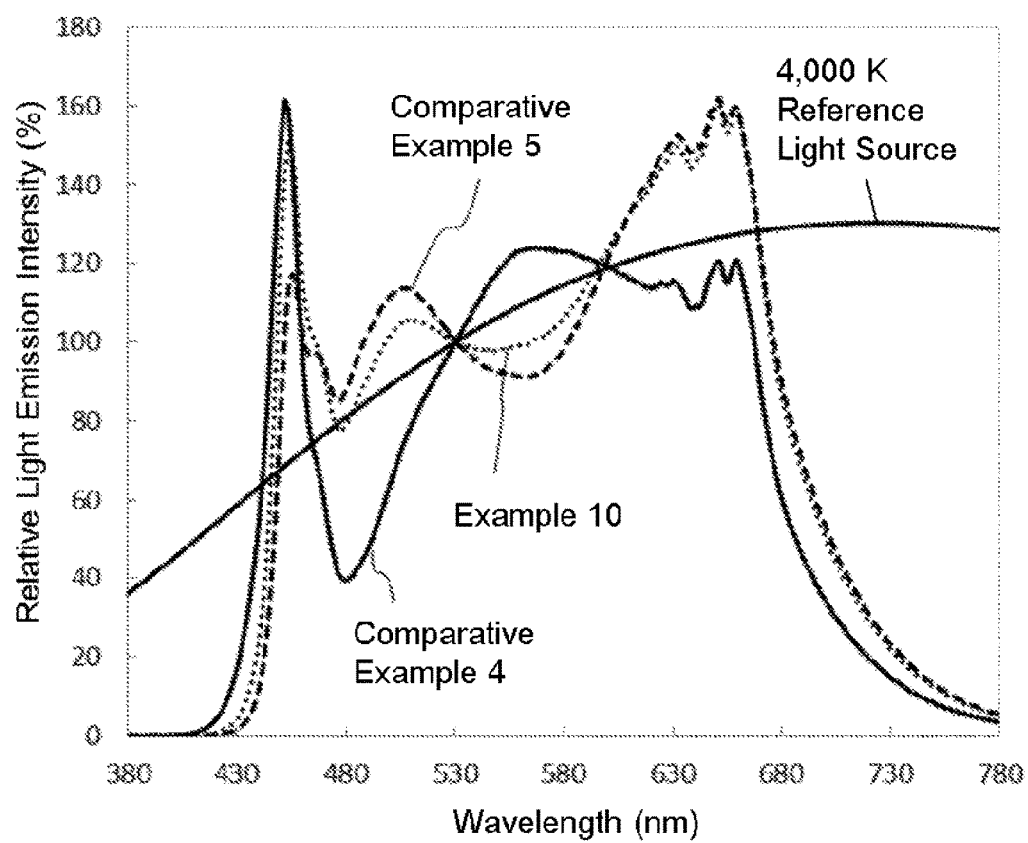
FIG. 6 is a graph showing the light emission spectra of light emitting devices of Example 10 and Comparative Examples 4 and 5.

FIG. 4 shows the light emission spectra of the light emitting devices of Comparative Example 4 and Examples 5 to 7, FIG. 5 shows the light emission spectra of the light emitting devices of Comparative Example 4 and Examples 8 and 9, and FIG. 6 shows the light emission spectra of the light emitting devices of Comparative Examples 4 and 5 and Example 10, the light emission spectra being normalized based on the light emission intensity at 530 nm. The light emission spectra in FIGS. 4 to 6 each shows the relative light emission intensity with respect to the wavelength. The spectrum of the reference light source at 4,000 K is also shown in the figures. As shown in Table 5, Examples 5 to 10 each has a light emission peak intensity ratio of the first fluorescent material 71 to the light emitting element 10 in a range of 0.40 or more and 0.75 or less. As shown in Table 6, Examples 5 to 10 each has Rt of 555 or more. It is understood from these values that particularly excellent color rendering property is obtained. As shown in Table 5, Example 8 has a light emission peak intensity ratio of the first fluorescent material 71 to the light emitting element 10 in a range of 0.60 or more and 0.65 or less. As shown in Table 6, Example 8 has Rt of 660 or more. It is understood from these values that particularly excellent color rendering property is obtained.

Examples 11 to 15

Light emitting devices were produced in the same manner as in Example 1 except that the amounts of the fluorescent materials were changed to make the content ratios shown in Table 9 below, and the correlated color temperature was controlled to around 6,500 K.

For the light emitting devices obtained in Examples 11 to 15, the results except for the color rendering indices are shown in Table 9 below, and the results of the color rendering indices are shown in Table 10 below.

TABLE 9

|  | Example 11 | Example 12 | Example 13 | Example 14 | Example 15 |
|---|---|---|---|---|---|
| Content ratio of fluorescent material (%) First fluorescent material/ total fluorescent material amount | 7.7 | 11.5 | 20.2 | 36.6 | 50.0 |
| Content ratio of fluorescent material (%) Second fluorescent material/ total fluorescent material amount | 23.0 | 23.1 | 19.2 | 18.8 | 16.7 |
| Content ratio of fluorescent material (%) Third fluorescent material/ total fluorescent material amount | 66.8 | 62.9 | 58.0 | 42.0 | 30.5 |
| Content ratio of fluorescent material (%) Fourth fluorescent material/ total fluorescent material amount | 2.5 | 2.5 | 2.6 | 2.7 | 2.8 |
| Content ratio of fluorescent materials First fluorescent material/ third fluorescent material | 0.12 | 0.18 | 0.35 | 0.87 | 1.64 |
| Light emission peak intensity ratio First fluorescent material/ light emitting device | 0.28 | 0.27 | 0.32 | 0.36 | 0.4 |
| Chromaticity coordinate    x | 0.32 | 0.308 | 0.321 | 0.313 | 0.318 |
| Chromaticity coordinate    y | 0.325 | 0.314 | 0.33 | 0.324 | 0.326 |
| Correlated color temperature (K) | 6125 | 6927 | 6057 | 6523 | 6217 |

TABLE 10

| | Example 11 | Example 12 | Example 13 | Example 14 | Example 15 |
|---|---|---|---|---|---|
| Ra | 90.5 | 92.3 | 93.4 | 96.7 | 93.4 |
| R1 | 91.7 | 93.5 | 94.2 | 96.7 | 91.1 |
| R2 | 92.5 | 93.7 | 95.2 | 98.7 | 93.7 |
| R3 | 88.5 | 89.2 | 92.5 | 96.3 | 98.4 |
| R4 | 91.3 | 93.7 | 94.1 | 97.8 | 93.7 |
| R5 | 90.4 | 91.7 | 92.7 | 95.7 | 92.3 |
| R6 | 85.2 | 86.3 | 89.2 | 93.4 | 92.2 |
| R7 | 94.4 | 95.8 | 96.2 | 97.7 | 94.6 |
| R8 | 91.0 | 94.1 | 92.9 | 97.3 | 91.2 |
| R9 | 73.6 | 81.8 | 79.7 | 96.9 | 74.7 |
| R10 | 79.3 | 82.3 | 86.6 | 97.3 | 87.6 |
| R11 | 89.9 | 92.7 | 93.6 | 97.7 | 92.1 |
| R12 | 61.0 | 61.3 | 65.5 | 69.5 | 73.8 |
| R13 | 92.2 | 94.4 | 95.2 | 98.3 | 91.2 |
| R14 | 93.4 | 93.9 | 95.8 | 97.8 | 98.4 |
| R15 | 93.7 | 95.5 | 94.9 | 94.7 | 88.1 |
| Rt | 583 | 602 | 611 | 652 | 606 |

Comparative Example 6

A light emitting device was produced in the same manner as in Example 1 except that SAE was not used, but a combination of MGF, YAG, and SCASN was used, and the correlated color temperature was controlled to around 6,000 K. The content ratios of the fluorescent materials are shown in Table 11 below.

Comparative Example 7

A light emitting device was produced in the same manner as in Example 1 except that the amounts of the fluorescent materials were changed to make the content ratios shown in Table 11 below.

For the light emitting devices obtained in Comparative Examples 6 and 7, the results except for the color rendering indices are shown in Table 11 below, and the results of the color rendering indices are shown in Table 12 below.

TABLE 11

| | | Comparative Example 6 | Comparative Example 7 |
|---|---|---|---|
| Content ratio of fluorescent material (%) First fluorescent material/ total fluorescent material amount | | — | 59.5 |
| Content ratio of fluorescent material (%) Second fluorescent material/ total fluorescent material amount | | 24.7 | 15.0 |
| Content ratio of fluorescent material (%) Third fluorescent material/ total fluorescent material amount | | 73.0 | 22.5 |
| Content ratio of fluorescent material (%) Fourth fluorescent material/ total fluorescent material amount | | 2.3 | 3.0 |
| Content ratio of fluorescent materials First fluorescent material/ third fluorescent material | | — | 2.6 |
| Light emission peak intensity ratio First fluorescent material/ light emitting device | | — | 0.44 |
| Chromaticity coordinate | x | 0.32 | 0.316 |
| | y | 0.326 | 0.322 |
| Correlated color temperature (K) | | 6091 | 6350 |

TABLE 12

| | Comparative Example 6 | Comparative Example 7 |
|---|---|---|
| Ra | 88.2 | 87.6 |
| R1 | 89.1 | 83.7 |
| R2 | 90.2 | 88.2 |
| R3 | 86.7 | 94.7 |
| R4 | 89.0 | 87.6 |
| R5 | 87.9 | 86.0 |
| R6 | 82.5 | 86.5 |
| R7 | 92.7 | 91.4 |
| R8 | 87.5 | 82.9 |
| R9 | 63.2 | 49.1 |
| R10 | 73.7 | 74.3 |
| R11 | 87.2 | 84.3 |
| R12 | 58.6 | 74.5 |
| R13 | 89.4 | 83.8 |
| R14 | 92.4 | 96.3 |
| R15 | 90.7 | 79.8 |
| Rt | 555 | 542 |

As can be observed in Tables 9 and 10, Examples 11 to 15 each has larger Rt than Comparative Examples 6 and 7. By controlling the amount of SAE, light emitting devices having high color rendering property may thus be provided.

As can be observed in Table 12, Comparative Examples 6 and 7 each has smaller Rt than the Examples, and poor color rendering property of the light emitting device was obtained.

As shown in Table 9, Examples 11 to 15 each has a correlated color temperature in a range of 5,500 K or more and 7,000 K or less. As shown in Table 9, Examples 11 to 15 each has a content ratio of SAE based on the total fluorescent material amount in a range of 7.5% by mass or more and 55.0% by mass or less, a content ratio of MGF based on the total fluorescent material amount in a range of 16.0% by mass or more and 24.0% by mass or less, a content ratio of YAG based on the total fluorescent material amount in a range of 25.0% by mass or more and 70.0% by mass or less, a content ratio of SCASN based on the total fluorescent material amount in a range of 2.4% by mass or more and 2.9% by mass or less, and a content ratio of the first fluorescent material 71 (SAE) based on the third fluorescent material 73 (YAG) in a range of 0.10 or more and 2.10 or less. According to the content ratios, the light emission spectrum of the light emitting device can be made close to the reference light source. As shown in Table 10, Examples 11 to 15 each has a general color rendering index Ra of 90 or more, special color rendering indices R9, R10, R11, R12, R13, R14, and R15 each of 60 or more, and Rt of 580 or more. It is understood from these values that particularly excellent color rendering property is obtained.

As shown in Table 9, Examples 13 and 14 each has a content ratio of SAE based on the total fluorescent material amount in a range of 15.0% by mass or more and 40.0% by mass or less, a content ratio of MGF based on the total fluorescent material amount in a range of 18.0% by mass or more and 20.0% by mass or less, a content ratio of YAG based on the total fluorescent material amount in a range of 35.0% by mass or more and 60.0% by mass or less, a content ratio of SCASN based on the total fluorescent material amount in a range of 2.6% by mass or more and 2.7% by mass or less, and a content ratio of the first fluorescent material 71 (SAE) based on the third fluorescent material 73 (YAG) in a range of 0.30 or more and 1.00 or less. As shown in Table 10, Examples 13 and 14 each has Rt of 610 or more. It is understood from these values that particularly excellent color rendering property is obtained.

Figure 7:
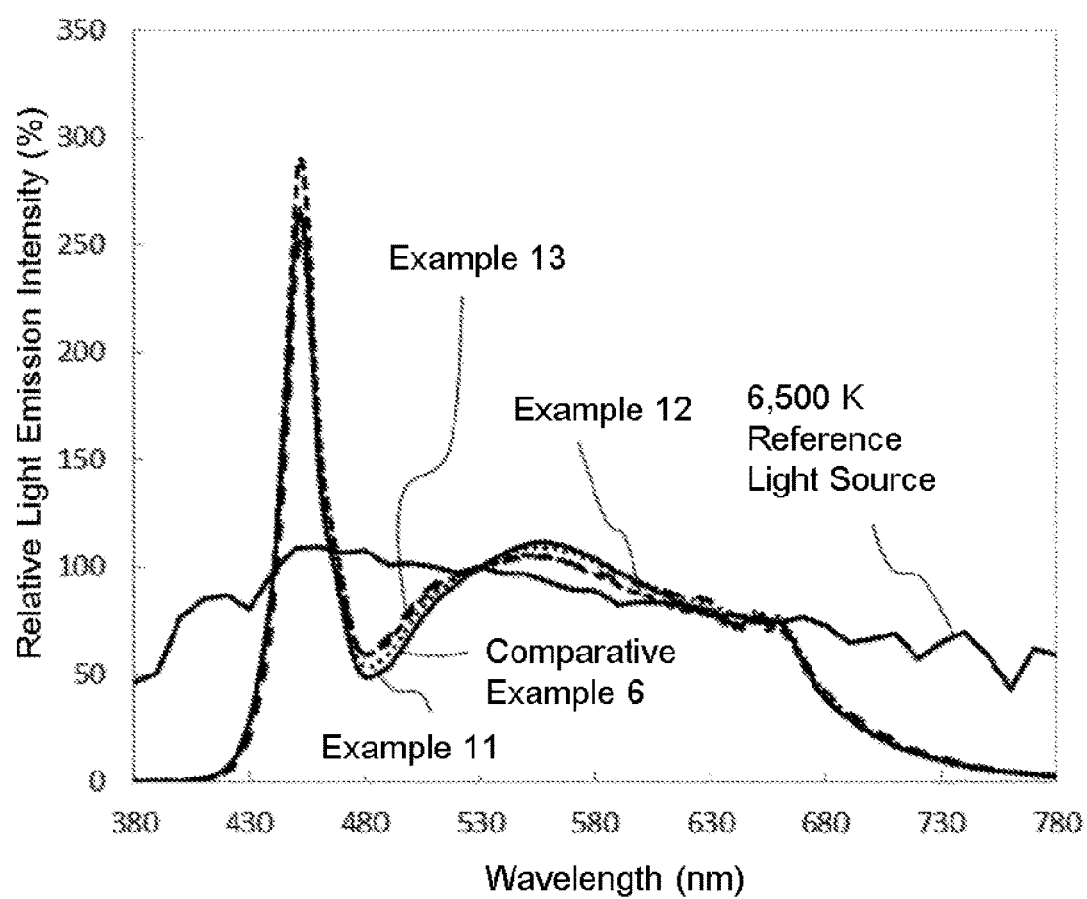
FIG. 7 is a graph showing the light emission spectra of light emitting devices of Examples 11 to 13 and Comparative Example 6.
Figure 8:
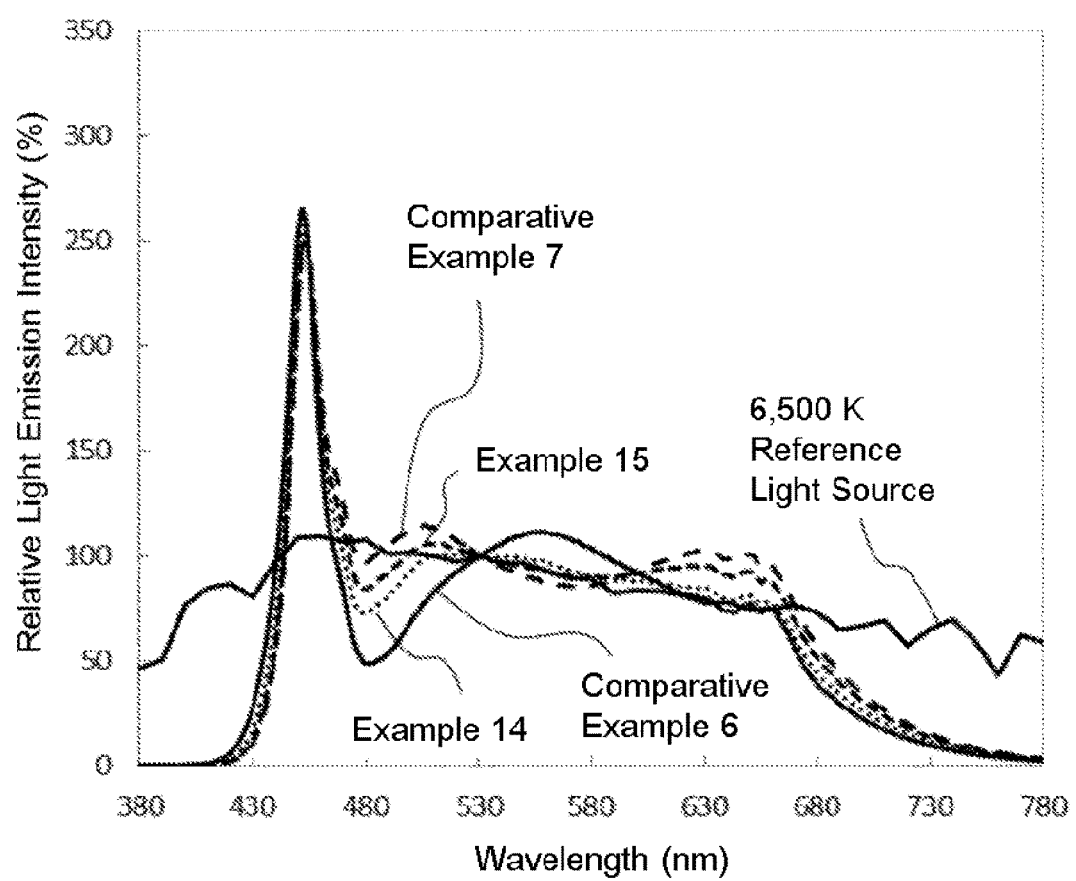
FIG. 8 is a graph showing the light emission spectra of the light emitting devices of Examples 14 and 15 and Comparative Examples 6 and 7.

FIG. 7 shows the light emission spectra of the light emitting devices of Comparative Example 6 and Examples 11 to 13, and FIG. 8 shows the light emission spectra of the light emitting devices of Comparative Examples 6 and 7 and Examples 14 and 15, in each which the light emission spectra are normalized based on the light emission intensity at 530 nm. The light emission spectra in FIGS. 7 and 8 each show the relative light emission intensity with respect to the wavelength. The spectrum of the reference light source at 6,500 K is also shown in the figures. As shown in Table 9, Examples 11 to 15 each has a light emission peak intensity ratio of the first fluorescent material 71 to the light emitting element 10 in a range of 0.25 or more and 0.42 or less. As shown in Table 10, Examples 11 to 15 each has Rt of 580 or more. It is understood from these values that particularly excellent color rendering property is obtained. As shown in Table 9, Examples 13 and 14 each has a light emission peak intensity ratio of the first fluorescent material 71 to the light emitting element 10 in a range of 0.30 or more and 0.38 or less. As shown in Table 10, Examples 13 and 14 each has Rt of 610 or more. It is understood from these values that particularly excellent color rendering property is obtained.

The light emitting device of the present disclosure can be applied to an illumination device, an LED display device, a flashlight for a camera, and the like, having excellent light emission characteristics using a blue light emitting diode or an ultraviolet light emitting diode as an excitation light source. The light emitting device of the present disclosure can be applied particularly favorably to an illumination device and a light source that are demanded to achieve high color rendering property.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light emitting device comprising:
a light emitting element having a light emission peak wavelength within a range of 430 nm or more and 470 nm or less, and
a fluorescent member, wherein
the light emitting device emitting light has a correlated color temperature in a range of 3,500 K or more and 4,500 K or less, and
the fluorescent member comprises:
a first fluorescent material that has a composition shown by the following formula (1),
a second fluorescent material that has a composition shown by the following formula (2),
a third fluorescent material that has a composition shown by the following formula (3), and
a fourth fluorescent material that has a composition shown by the following formula (4), wherein
the first fluorescent material has a content ratio in a range of 16.5% by mass or more and 50.0% by mass or less based on a total fluorescent material amount,
the second fluorescent material has a content ratio in a range of 28.0% by mass or more and 33.0% by mass or less based on the total fluorescent material amount,
the third fluorescent material has a content ratio in a range of 20.0% by mass or more and 35.0% by mass or less based on the total fluorescent material amount, and
the fourth fluorescent material has a content ratio in a range of 3.0% by mass or more and 3.2% by mass or less based on the total fluorescent material amount, $$Sr_4Al_{14}O_{25}:Eu \tag{1}$$

$$(x-s)MgO.(s/2)Sc_2O_3.yMgF_2.uCaF_2.(1-t)GeO_2.(t/2)M_2O_3:zMn^{4+} \tag{2}$$

wherein in the formula (2), M represents at least one element selected from the group consisting of Al, Ga, and In, and x, y, z, s, t, and u respectively satisfy $2 \leq x \leq 4$, $0 < y < 1.5$, $0 < z < 0.05$, $0 \leq s < 0.5$, $0 < t < 0.5$, and $0 \leq u < 1.5$, $$Y_3Al_5O_{12}:Ce \tag{3}$$

$$(Sr,Ca)AlSiN_3:Eu \tag{4}.$$

2. The light emitting device according to claim 1, wherein a content ratio of the first fluorescent material to the third fluorescent material is in a range of 0.05 or more and 3.00 or less.

3. The light emitting device according to claim 1, wherein a light emission peak intensity ratio of the first fluorescent material based on a light emission peak intensity of the light emitting element is in a range of 0.40 or more and 0.75 or less.

4. The light emitting device according to claim 1, wherein the first fluorescent material has the half value width of the light emission spectrum in a range of 58 nm or more and 78 nm or less.

5. The light emitting device according to claim 1, wherein the second fluorescent material has the half value width of the light emission spectrum in a range of 45 nm or less.

6. The light emitting device according to claim 1, wherein the third fluorescent material has the half value width of the light emission spectrum in a range of 95 nm or more and 115 nm or less.

7. The light emitting device according to claim 1, wherein the fourth fluorescent material has the half value width of the light emission spectrum in a range of 80 nm or more and 100 nm or less.

8. The light emitting device according to claim 1, wherein a sum of the special color rendering indices R9, R10, R11, R12, R13, R14 and R15 is larger than 600.

9. A light emitting device comprising:
a light emitting element having a light emission peak wavelength within a range of 430 nm or more and 470 nm or less, and
a fluorescent member, wherein
the light emitting device emitting light has a correlated color temperature in a range of 4,500 K or more and 5,500 K or less, and
the fluorescent member comprises:
a first fluorescent material that has a composition shown by the following formula (1),
a second fluorescent material that has a composition shown by the following formula (2),
a third fluorescent material that has a composition shown by the following formula (3), and
a fourth fluorescent material that has a composition shown by the following formula (4), wherein
the first fluorescent material has a content ratio in a range of 7.0% by mass or more and 55.0% by mass or less based on a total fluorescent material amount,
the second fluorescent material has a content ratio in a range of 22.0% by mass or more and 31.0% by mass or less based on the total fluorescent material amount,
the third fluorescent material has a content ratio in a range of 20.0% by mass or more and 55.0% by mass or less based on the total fluorescent material amount, and
the fourth fluorescent material has a content ratio in a range of 2.8% by mass or more and 3.0% by mass or less based on the total fluorescent material amount, $$Sr_4Al_{14}O_{25}:Eu \quad (1)$$

$$(x-s)MgO.(s/2)Sc_2O_3.yMgF_2.uCaF_2.(1-t)GeO_2.(t/2)M_2O_3:zMn^{4+} \quad (2)$$

wherein in the formula (2), M represents at least one element selected from the group consisting of Al, Ga, and In, and x, y, z, s, t, and u respectively satisfy $2 \leq x \leq 4$, $0 < y < 1.5$, $0 < z < 0.05$, $0 \leq s < 0.5$, $0 < t < 0.5$, and $0 \leq u < 1.5$, $$Y_3Al_5O_{12}:Ce \quad (3)$$

$$(Sr,Ca)AlSiN_3:Eu \quad (4).$$

10. The light emitting device according to claim 9, wherein a content ratio of the first fluorescent material to the third fluorescent material is in a range of 0.06 or more and 4.70 or less.

11. The light emitting device according to claim 9, wherein a light emission peak intensity ratio of the first fluorescent material based on a light emission peak intensity of the light emitting element is in a range of 0.34 or more and 0.60 or less.

12. The light emitting device according to claim 9, wherein the first fluorescent material has the half value width of the light emission spectrum in a range of 58 nm or more and 78 nm or less.

13. The light emitting device according to claim 9, wherein the second fluorescent material has the half value width of the light emission spectrum in a range of 45 nm or less.

14. The light emitting device according to claim 9, wherein the third fluorescent material has the half value width of the light emission spectrum in a range of 95 nm or more and 115 nm or less.

15. The light emitting device according to claim 9, wherein the fourth fluorescent material has the half value width of the light emission spectrum in a range of 80 nm or more and 100 nm or less.

16. The light emitting device according to claim 9, wherein a sum of the special color rendering indices R9, R10, R11, R12, R13, R14 and R15 is larger than 570.

17. A light emitting device comprising:
a light emitting element having a light emission peak wavelength within a range of 430 nm or more and 470 nm or less, and
a fluorescent member, wherein
the light emitting device emitting light has a correlated color temperature in a range of 5,500 K or more and 7,000 K or less, and
the fluorescent member comprises:
a first fluorescent material that has a composition shown by the following formula (1),
a second fluorescent material that has a composition shown by the following formula (2),
a third fluorescent material that has a composition shown by the following formula (3), and
a fourth fluorescent material that has a composition shown by the following formula (4), wherein
the first fluorescent material has a content ratio in a range of 15.0% by mass or more and 40.0% by mass or less based on a total fluorescent material amount,
the second fluorescent material has a content ratio in a range of 18.0% by mass or more and 20.0% by mass or less based on the total fluorescent material amount,
the third fluorescent material has a content ratio in a range of 35.0% by mass or more and 60.0% by mass or less based on the total fluorescent material amount, and
the fourth fluorescent material has a content ratio in a range of 2.6% by mass or more and 2.7% by mass or less based on the total fluorescent material amount, $$Sr_4Al_{14}O_{25}:Eu \quad (1)$$

$$(x-s)MgO.(s/2)Sc_2O_3.yMgF_2.uCaF_2.(1-t)GeO_2.(t/2)M_2O_3:zMn^{4+} \quad (2)$$

wherein in the formula (2), M represents at least one element selected from the group consisting of Al, Ga, and In, and x, y, z, s, t, and u respectively satisfy $2 \leq x \leq 4$, $0<y<1.5$, $0<z<0.05$, $0 \leq s<0.5$, $0<t<0.5$, and $0 \leq u<1.5$, $$Y_3Al_5O_{12}:Ce \qquad (3)$$

$$(Sr,Ca)AlSiN_3:Eu \qquad (4).$$

18. The light emitting device according to claim 17, wherein a content ratio of the first fluorescent material to the third fluorescent material is in a range of 0.10 or more and 2.10 or less.

19. The light emitting device according to claim 17, wherein a light emission peak intensity ratio of the first fluorescent material based on a light emission peak intensity of the light emitting element is in a range of 0.25 or more and 0.42 or less.

20. The light emitting device according to claim 17, wherein the first fluorescent material has the half value width of the light emission spectrum in a range of 58 nm or more and 78 nm or less.

21. The light emitting device according to claim 17, wherein the second fluorescent material has the half value width of the light emission spectrum in a range of 45 nm or less.

22. The light emitting device according to claim 17, wherein the third fluorescent material has the half value width of the light emission spectrum in a range of 95 nm or more and 115 nm or less.

23. The light emitting device according to claim 17, wherein the fourth fluorescent material has the half value width of the light emission spectrum in a range of 80 nm or more and 100 nm or less.

24. The light emitting device according to claim 17, wherein a sum of the special color rendering indices R9, R10, R11, R12, R13, R14 and R15 is larger than 610.

* * * * *